United States Patent
Fukaya et al.

(10) Patent No.: US 9,798,230 B2
(45) Date of Patent: Oct. 24, 2017

(54) PHOTOMASK BLANK

(71) Applicant: Shin-Etsu Chemical Co., Ltd., Tokyo (JP)

(72) Inventors: Souichi Fukaya, Joetsu (JP); Kouhei Sasamoto, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 174 days.

(21) Appl. No.: 14/852,242

(22) Filed: Sep. 11, 2015

(65) Prior Publication Data

US 2016/0077425 A1   Mar. 17, 2016

(30) Foreign Application Priority Data

Sep. 12, 2014   (JP) .................................. 2014-186290

(51) Int. Cl.
*G03F 1/50* (2012.01)
*G03F 1/54* (2012.01)

(52) U.S. Cl.
CPC . *G03F 1/50* (2013.01); *G03F 1/54* (2013.01)

(58) Field of Classification Search
CPC .................................... G03F 1/50; G03F 1/54
USPC ............................................................ 430/5
See application file for complete search history.

(56) References Cited

U.S. PATENT DOCUMENTS

| | | | |
|---|---|---|---|
| 5,474,864 A | 12/1995 | Isao et al. | |
| 7,767,367 B2 | 8/2010 | Yoshikawa et al. | |
| 7,989,124 B2 | 8/2011 | Yoshikawa et al. | |
| 8,148,036 B2 | 4/2012 | Inazuki et al. | |
| 2009/0246647 A1 | 10/2009 | Hashimoto et al. | |
| 2009/0325084 A1 | 12/2009 | Hashimoto et al. | |
| 2013/0095415 A1 | 4/2013 | Nam et al. | |

FOREIGN PATENT DOCUMENTS

| | | |
|---|---|---|
| EP | 2 237 109 A2 | 10/2010 |
| JP | 7-140635 A | 6/1995 |
| JP | 2007-241060 A | 9/2007 |
| JP | 2009-244752 A | 10/2009 |
| JP | 2010-237499 A | 10/2010 |
| JP | 2013-88814 A | 5/2013 |

OTHER PUBLICATIONS

Extended European Search Report, dated Jun. 24, 2016, for European Application No. 15183324.1.
Japanese Office Action, dated May 23, 2017, for Japanese Application No. 2014-186290.

*Primary Examiner* — Christopher Young
(74) *Attorney, Agent, or Firm* — Birch, Stewart, Kolasch & Birch, LLP

(57) ABSTRACT

A photomask blank includes a chromium-based material film as a hard mask film containing at least one selected from the group consisting of nitrogen, oxygen, carbon and hydrogen, wherein a ratio (A/B) of etching rates per unit film thickness is in a range from 0.7 to 0.9, and the chromium-based material film has a tensile stress or compressive stress corresponding to an amount of warp of up to 70 nm. The present invention provides a photomask blank having a thin film of chromium-based material which is enhanced in etch resistance and lowered in film stress. This enables high-accuracy patterning of a chromium-based material film.

16 Claims, No Drawings

PHOTOMASK BLANK

CROSS-REFERENCE TO RELATED APPLICATION

This non-provisional application claims priority under 35 U.S.C. §119(a) on Patent Application No. 2014-186290 filed in Japan on Sep. 12, 2014, the entire contents of which are hereby incorporated by reference.

TECHNICAL FIELD

The present invention relates to a photomask blank as a raw material for a photomask used in the microfabrication of semiconductor integrated circuits, charge-coupled devices (CCD), liquid crystal display (LCD) color filters, magnetic heads or the like.

BACKGROUND ART

In the recent semiconductor processing technology, the trend toward higher integration of large-scale integrated circuits, particularly, places an increasing demand for miniaturization of circuit patterns. There are increasing demands for further reduction in size of circuit-constructing wiring patterns and for miniaturization of contact hole patterns for cell-constructing inter-layer connections. As a consequence, in the manufacture of circuit pattern-bearing photomasks for use in the photolithography of forming such wiring patterns and contact hole patterns, also, a technique which enables accurate writing of finer circuit patterns is needed to meet the miniaturization demand.

In order to form a higher accuracy photomask pattern on a photomask substrate, it is of first priority to form a high accuracy resist pattern on a photomask blank. Since the photolithography used in actually processing semiconductor substrates involves reduction projection, the photomask pattern has a size of about four times the actually needed pattern size, but the accuracy requirement is not moderated accordingly. The photomask serving as an original is rather required to have a higher accuracy than the pattern accuracy to be attained after exposure.

Further, in the currently prevailing lithography, a circuit pattern to be written has a feature size far smaller than the wavelength of light used. If a photomask pattern which is a mere four-time magnification of the circuit feature is used, a shape corresponding exactly to the photomask pattern is not transferred to the resist film, due to the influences of optical interference or the like occurring in the actual photolithography operation. To mitigate these influences, in some cases, the photomask pattern is required to be designed to a shape which is more complex than the actual circuit pattern, i.e., a shape which is obtained by application of the so-called optical proximity correction (OPC) or the like. Thus, at present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography involved in the semiconductor processing step using a photomask.

From a photomask blank having an optical film (e.g., light-shielding film or phase shift film) on a transparent substrate, a photomask pattern is generally formed by coating a photoresist film on the blank, writing a pattern using electron beam, and developing to form a resist pattern.

Using the resulting resist pattern as an etch mask, the optical film is then etched into an optical film pattern. In an attempt to miniaturize the optical film pattern, if processing is carried out while maintaining the thickness of the resist film at the same level as in the art prior to the miniaturization attempt, the ratio of film thickness to feature width, known as aspect ratio, becomes higher. As a result, the resist pattern profile is degraded to prevent effective pattern transfer, and in some cases, resist pattern collapse or peeling can occur. Therefore, the thickness of resist film needs to be reduced in accordance with the degree of miniaturization. However, as the resist film becomes thinner, the resist pattern is more susceptible to damage during dry etching of the optical film, undesirably resulting in a lowering of dimensional accuracy of a transferred pattern.

One known method of producing a high accuracy photomask using a thinner resist film involves forming a film separate from the optical film (e.g., light-shielding film or halftone phase shift film) as a processing-aid film. Specifically, a hard mask film is formed between the resist film and the optical film, the resist pattern is transferred to the hard mask film, and dry etching of the optical film is then carried out using the resulting hard mask pattern. JP-A 2007-241060 (Patent Document 1) discloses an exemplary method by which to form a finer pattern. With the intention to establish finer photolithography technology, a light-shielding film is formed of a material of a transition metal and silicon compound capable of shielding ArF excimer laser light despite a thinner film, and a chromium-based material film is used as the hard mask film for processing the light-shielding film, whereby higher accuracy processing becomes possible. Also, JP-A 2010-237499 (Patent Document 2) discloses a photomask of similar construction to Patent Document 1 wherein the hard mask film is of multilayer structure such that the stress introduced during deposition thereof may be mitigated for thereby preventing any drop of processing accuracy during preparation of a photomask.

CITATION LIST

Patent Document 1: JP-A 2007-241060
Patent Document 2: JP-A 2010-237499
Patent Document 3: JP-A H07-140635

DISCLOSURE OF INVENTION

According to the introduction of the immersion lithography, double patterning method or the like, life cycle of a technology of the photolithography using ArF excimer laser light is assuredly prolonged to the 20-nm node as the semiconductor processing criterion. There is a possibility that the ArF photolithography will be applied to still finer structures. For a photomask for forming such a fine pattern, the permissible error is naturally reduced and a high accuracy of patterning is necessary. To form a finer pattern, in turn, the resist film must be thinner. Then the mask processing technology using a hard mask film becomes more useful, and a further improvement thereof may be needed.

For example, when a hard mask film itself is processed using the resist pattern, one of important considerations is to improve the processing accuracy. A hard mask film of a chromium-based material is also etched, to be gradually reduced in thickness, at the time of etching of a film therebeneath. If the hard mask film disappears before the film therebeneath is formed into a desired pattern, a film portion to be left in the desired pattern beneath the hard mask film would be etched away, so that the desired pattern cannot be formed.

In order to ensure that the hard mask film is left in some thickness when the intended etching of the film therebeneath is just completed, increasing the thickness of the hard mask film may be contemplated. However, when the pattern to be formed includes finer features as in the manufacture of a photomask to be used for processing a 20-nm node pattern, a hard mask film having a comparatively small thickness must be used. Besides, an increase in the thickness of the hard mask film leads to such problems as collapse of patterns. Therefore, a thick hard mask film is not suited to the manufacture of a photomask which needs fine processing.

Another approach is to enhance the etch resistance of the hard mask film. In order to enhance the etch resistance, the oxygen content of the chromium-based material hard mask need to be lowered. A lowering of oxygen content, however, tends to increase the film stress.

Furthermore, where a plurality of photomasks are used for forming a multilayer structure for devices, a high overlay accuracy is required. In addition, the overlay accuracy should be enhanced as the pattern miniaturization progresses.

Where a stress is generated in the hard mask film, however, there arises the following problem. When patterning of a hard mask film is conducted by subjecting a photomask blank to such steps as coating with a resist, exposure, development, etching, and stripping of the resist, the film stress existing in the hard mask film is partly liberated, leading to the generation of strains in the etching of the underlying film by use of the hard mask pattern. As a result, strains are generated in the photomask pattern which is obtained finally. If such strains are present in the photomask, the pattern position accuracy of the photomask is lowered.

Accordingly, an object of the present invention is to provide a photomask blank having a thin film of chromium-based material having a high etch resistance and a low film stress for use as a hard mask film or the like in etching.

The inventors found that a photomask blank having a hard mark film of a chromium-based material enhanced in etch resistant and lowered in film stress can be provided when a chromium-based material film containing at least one selected from the group consisting of nitrogen, oxygen, carbon and hydrogen is used as a hard mask film, the chromium-based material film is a hard mask film, a ratio (A/B) of A representing etching rate per unit film thickness of the chromium-based material film in chlorine-based dry etching to B representing etching rate per unit film thickness of a film composed only of chromium in the chlorine-based dry etching is in a range from 0.7 to 0.9, and when the chromium-based material film is formed on a quartz substrate having 152 mm square dimensions and 6.35 mm in thickness, and subjected to a heat treatment at a temperature of at least 150° C. for a time of at least 10 minutes, the chromium-based material film has a tensile stress or compressive stress corresponding to an amount of warp of up to 70 nm.

Accordingly, in one aspect, the present invention provides a photomask blank including a quartz substrate and a chromium-based material film formed on the quartz substrate, the chromium-based material film containing at least one selected from the group consisting of nitrogen, oxygen, carbon and hydrogen. The chromium-based material film is a hard mask film, and the chromium-based material film has a ratio (A/B) of A representing etching rate per unit film thickness of the chromium-based material film in chlorine-based dry etching to B representing etching rate per unit film thickness of a film composed only of chromium in chlorine-based dry etching is in a range from 0.7 to 0.9, and when the chromium-based material film is formed on a quartz substrate, 152 mm square dimensions and 6.35 mm in thickness, and subjected to a heat treatment at a temperature of at least 150° C. for a time of at least 10 minutes, the chromium-based material film has a tensile stress or compressive stress corresponding to an amount of warp of up to 70 nm.

In the photomask blank as above, preferably, the amount of warp is up to 50 nm.

In the photomask blank as above, preferably, the ratio (A/B) is in a range from 0.75 to 0.85.

In the photomask blank as above, preferably, the chromium-based material film has a thickness of in a range of 4 nm to 50 nm.

In the photomask blank as above, preferably, the temperature of the heat treatment is up to 300° C.

In the photomask blank as above, preferably, the chromium-based material film is a CrCNO film.

In the photomask blank as above, preferably, the chromium-based material film is a monolayer film.

ADVANTAGEOUS EFFECTS OF INVENTION

The present invention provides a photomask blank having a thin film of chromium-based material which is enhanced in etch resistance and lowered in film stress. This enables high-accuracy patterning of a chromium-based material film. The use of the photomask blank of the present invention and processing thereof into a photomask ensure that the resulting photomask can be used with enhanced reliability, specifically for lithography of up to 20 nm node.

DESCRIPTION OF PREFERRED EMBODIMENTS

The photomask blank of the present invention includes a quartz substrate and a hard mask film formed on the quartz substrate. The hard mask film is a chromium-based material film containing at least one selected from the group consisting of nitrogen, oxygen, carbon and hydrogen. In addition, the chromium-based material film is characterized in that:

(i) the chromium-based material film has a ratio (A/B) of A to B of in a range from 0.7 to 0.9, preferably from 0.75 to 0.85, wherein A represents etching rate per unit film thickness of the chromium-based material film in chlorine-based dry etching, and B represents etching rate per unit film thickness of a film composed only of chromium in chlorine-based dry etching; and (ii) the chromium-based material film has a tensile stress or compressive stress, wherein the stress corresponds to an amount of warp of the chromium-based material film of up to 70 nm, preferably up to 50 nm, when the chromium-based material film is formed on a quartz substrate having 152 mm square dimensions and 6.35 mm in thickness, and subjected to a heat treatment at a temperature of at least 150° C., preferably in a range of 150 to 300° C., for a time of at least 10 minutes.

If the film stress in a photomask blank is high, the film stress is partly liberated during processing of the photomask blank into a pattern, to generate strains in the photomask obtained finally. Due to the strains, the pattern position accuracy of the photomask would be lowered.

Where a thin film is formed beneath the chromium-based material film, the thin film may be patterned while leaving the pattern of the chromium-based material film. In this case, the chromium-based material film is also etched, more or less, during the etching of the thin film therebeneath. If the chromium-based material film is low in etch resistance, the chromium-based material film may partly disappear during the etching of the underlying film. In such a situation, those portions of the underlying film which need not be etched away would be etched away.

The photomask blank of the present invention is a photomask blank provided with a chromium-based material film enhanced in etch resistance and lowered in film stress. In this photomask blank, the chromium-based material film shows an enhanced pattern position accuracy, and the chromium-based material film is sufficiently left even upon etching of the underlying film.

The chlorine-based dry etching for the chromium-based material film in the present invention is preferably oxygen-containing chlorine-based dry etching in which oxygen gas ($O_2$ gas) and chlorine gas ($Cl_2$ gas) are used. Specifically, as the aforementioned etching rate in the chlorine-based dry etching, there can be applied an etching rate in etching conducted using an etching gas containing oxygen gas and chlorine gas in a molar ratio [($O_2$ gas)/($Cl_2$ gas)] of 55/185.

The chromium-based material film may be a multilayer film, but it is preferably a monolayer film. Besides, the thickness of the chromium-based material film is preferably in a range of 4 to 50 nm.

The chromium-based material film is a chromium-based material film which contains at least one selected from the group consisting of nitrogen, oxygen, carbon and hydrogen. Especially preferred is a CrCNO film, namely, a film composed of chromium, nitrogen, oxygen and carbon. In this case, the film preferably has a chromium content of 50 to 78 atom %, a nitrogen content of 2 to 10 atom %, an oxygen content of 10 to 20 atom %, and a carbon content of 10 to 20 atom %.

An increase in the oxygen content of the chromium-based material film can reduce film stress, but tends to lower the etch resistance of the film. On the other hand, an increase in chromium content enhances the etch resistance, but tends to increase the film stress. The chromium-based material film of the photomask blank of the present invention is formed to have a desired etch resistance and a desired film stress, by appropriately setting the conditions for film formation and the contents of light elements in the film.

The chromium-based material film to be used in the present invention may be formed by a sputtering method. The sputtering method may be either direct current (DC) sputtering or radio frequency (RF) sputtering, as described in JP-A H07-140635 (Patent Document 3), for example, and there may be employed any of those well-known methods. The target used is typically a chromium target although a chromium target containing nitrogen may also be used.

The sputtering is preferably reactive sputtering. As the sputtering gas, there may be used a combination of a well-known inert gas and a well-known reactive gas, specifically a combination of an inert gas such as argon gas (Ar gas) with a reactive gas such as nitrogen gas ($N_2$ gas), nitrogen oxide gas ($N_2O$ gas or $NO_2$ gas), oxygen gas ($O_2$ gas) and carbon oxide gas (CO gas or $CO_2$ gas). Particularly, where a CrCNO film is to be deposited, a combination of argon gas (Ar gas) as inert gas with nitrogen gas ($N_2$ gas) and carbon dioxide gas ($CO_2$ gas) as reactive gas may be used, preferably with such an adjustment that the desired film composition can be obtained. Besides, in order to obtain a multilayer film, a film whose composition varies stepwise or continuously may be formed by performing deposition while the composition of the sputtering gas is changed stepwise or continuously, for example.

The gas pressure during film deposition may be appropriately set in consideration of the film stress, chemical resistance, cleaning resistance and the like of the resulting film. Chemical resistance is improved when the gas pressure is set to within a range of normally 0.01 to 1 Pa, particularly 0.03 to 0.3 Pa. The flow rates of gases may be appropriately determined so as to obtain the desired composition, and are ordinarily in a range of 0.1 to 100 sccm. In this case, the flow rate ratio of the reactive gas to the inert gas is preferably at least 0.4, and more preferably up to 5. Furthermore, the electric power impressed on the sputtering target may be appropriately set in consideration of the target size, cooling efficiency, ease of control of film deposition and the like; usually, the power per area of the sputtering surface of the target may be in a range of 0.1 to 10 W/cm$^2$.

The hard mask film of chromium-based material in the present invention is provided in proximity to, preferably in contact with, the optical film which is a film to be processed deposited on a quartz substrate. The optical film may be a light-shielding film or a phase shift film, such as a halftone phase shift film.

The photomask blank of the present invention is suitable as a material for manufacture of a photomask to be used in photolithography in which ArF excimer laser light (wavelength: 193 nm) is employed for exposure.

EXAMPLES

The present invention will be described more specifically below referring to Examples and Comparative Examples, but not to be limited to the Examples.

Example 1

A chromium-based material film (41 nm thick) composed of CrCNO was deposited on a substrate by use of a DC sputtering system. Argon gas, nitrogen gas and carbon dioxide gas were used as sputtering gas in a flow rate ratio of Ar:$N_2$:$CO_2$=5:1:2.75 (molar ratio), with such a control that the gas pressure inside the sputtering chamber would be 0.08 Pa. Using a Cr target, the deposition was conducted while rotating the substrate at 30 rpm.

In addition, a film (26 nm thick) consisting only of Cr was deposited on a substrate by use of a DC sputtering system. Argon gas was used as the sputtering gas, with such a control that the gas pressure inside the sputtering chamber would be 0.07 Pa. Using a Cr target, the deposition was performed while rotating the substrate at 30 rpm.

Each of the chromium-based material film and the film consisting only of Cr (pure chromium film) obtained above was subjected to chlorine-based dry etching, and etching rate per unit film thickness thereof was determined. The dry etching was conducted in the following conditions.

RF1 (RIE) pulse: 700 V
RF2 (ICP) CW: 400 W
Pressure: 6 mTorr
$Cl_2$: 185 sccm
$O_2$: 55 sccm
He: 9.25 sccm In Table 1 below, there is shown the ratio (A/B) of the etching rate of the chromium-based material film (A) to the etching rate of the pure chromium film (B).

Besides, the chromium-based material film obtained above was subjected to a heat treatment at 150° C. for 10 minutes. The amount of warp of the chromium-based material film upon the heat treatment was determined while using the amount of warp of the transparent substrate before the deposition of the chromium-based material film thereon as a reference. The amount of warp was measured using a flatness tester Tropel UltraFlat (Corning Tropel Corp.). The amount of warp is shown in Table 1. A positive value of the amount of warp represents that warpage is due to tensile stress, whereas a negative value of the amount of warp represents that warpage is due to compressive stress.

Example 2

A chromium-based material film (39 nm thick) composed of CrCNO was deposited on a substrate by use of a DC sputtering system. Argon gas, nitrogen gas and carbon dioxide gas were used as sputtering gas in a flow rate ratio of $Ar:N_2:CO_2=5:1:2$ (molar ratio), with such a control that the gas pressure inside the sputtering chamber would be 0.08 Pa. Using a Cr target, the deposition was conducted while rotating the substrate at 30 rpm. For the chromium-based material film thus obtained, the ratio (A/B) of etching rate per unit film thickness and the amount of warp were determined in the same manner as in Example 1. The results are set forth in Table 1.

Comparative Example 1

A chromium-based material film (44 nm thick) composed of CrON was deposited on a substrate by use of a DC sputtering system. Argon gas, nitrogen gas and oxygen gas were used as sputtering gas in a flow rate ratio of $Ar:N_2:O_2=2.5:7.5:4$ (molar ratio), with such a control that the gas pressure inside the sputtering chamber would be 0.13 Pa. Using a Cr target, the deposition was conducted while rotating the substrate at 30 rpm. For the chromium-based material film thus obtained, the ratio (A/B) of etching rate per unit film thickness and the amount of warp were determined in the same manner as in Example 1. The results are shown in Table 1.

Comparative Example 2

A chromium-based material film (40 nm thick) composed of CrN was deposited on a substrate by use of a DC sputtering system. Argon gas and nitrogen gas were used as sputtering gas in a flow rate ratio of $Ar:N_2=5:1$ (molar ratio), with such a control that the gas pressure inside the sputtering chamber would be 0.07 Pa. Using a Cr target, the deposition was performed while rotating the substrate at 30 rpm. For the chromium-based material film thus obtained, the ratio (A/B) of etching rate per unit film thickness and the amount of warp were determined in the same manner as in Example 1. The results are set forth in Table 1.

TABLE 1

|  | Etching rate ratio (A/B) [—] | Amount of warp [nm] |
| --- | --- | --- |
| Comparative Example 1 | 0.59 | 10 |
| Example 1 | 0.77 | 48 |
| Example 2 | 0.83 | 67 |
| Comparative Example 2 | 0.93 | 150 |

In Comparative Example 1, the flow rate ratio of the reactive gases to the inert gas in depositing the chromium-based material film was raised as aforementioned, whereby the warpage was reduced but the etching rate was lowered. On the other hand, in Comparative Example 2, the flow rate ratio of the reactive gas to the inert gas in depositing the chromium-based material film was lowered, whereby the etching rate was enhanced but the warpage was increased. In contrast, Examples 1 and 2 produced chromium-based material films which are suitable for practical use in regard of both etching rate and the amount of warp.

The chromium-based material films obtained in Examples 1 and 2 are thin films of chromium-based material which are enhanced in etch resistance and lowered in film stress. This makes it possible to provide a photomask blank wherein a chromium-based material film shows an enhanced pattern position accuracy, and the chromium-based material film is sufficiently left upon etching of a film therebeneath. Consequently, patterning of a chromium-based material film with higher accuracy than in the related art can be achieved. In addition, the use of the photomask blank of the present invention and processing thereof into a photomask ensure that the resulting photomask can be used with enhanced reliability for lithography of up to 20 nm node.

Japanese Patent Application No. 2014-186290 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a quartz substrate and a chromium-based material film formed on the quartz substrate, the chromium-based material film comprising 50 to 78 atom % of chromium, and at least one selected from the group consisting of nitrogen, oxygen, carbon and hydrogen, wherein the chromium-based material film is a hard mask film, a ratio (A/B) of A representing etching rate per unit film thickness of the chromium-based material film in chlorine-based dry etching to B representing etching rate per unit film thickness of a film composed only of chromium in said chlorine-based dry etching is in a range from 0.7 to 0.9, and when the chromium-based material film is formed on a quartz substrate having 152 mm square dimensions and 6.35 mm in thickness, and subjected to a heat treatment at a temperature of at least 150° C. for a time of at least 10 minutes, the chromium-based material film has a tensile stress or compressive stress corresponding to an amount of warp of up to 70 nm.

2. The photomask blank of claim 1, wherein the amount of warp is up to 50 nm.

3. The photomask blank of claim 1, wherein the ratio (A/B) is in a range from 0.75 to 0.85.

4. The photomask blank of claim 1, wherein the chromium-based material film has a thickness of in a range of 4 nm to 50 nm.

5. The photomask blank of claim 1, wherein the temperature of the heat treatment is up to 300° C.

6. The photomask blank of claim 1, wherein the chromium-based material film is a CrCNO film.

7. The photomask bank of claim 1, wherein the chromium-based material film is a monolayer film.

8. The photomask blank of claim 1, wherein the chromium-based material film comprises 2 to 10 atom % of nitrogen, 10 to 20 atom % of oxygen and 10 to 20 atom % of carbon.

9. A method of manufacturing a photomask blank comprising a quartz substrate and a chromium-based material film comprising chromium, and at least one selected from the group consisting of nitrogen, oxygen, carbon and hydrogen formed on the quartz substrate, the chromium-based material film being a hard mask film,
a ratio (A/B) of A representing etching rate per unit film thickness of the chromium-based material film in chlorine-based dry etching to B representing etching rate per unit film thickness of a film composed only of chromium in said chlorine-based dry etching being in a range from 0.7 to 0.9, and
when the chromium-based material film is formed on a quartz substrate having 152 mm square dimensions and 6.35 mm in thickness, and subjected to a heat treatment at a temperature of at least 150° C. for a time of at least 10 minutes, the chromium-based material film having a tensile stress or compressive stress corresponding to an amount of warp of up to 70 nm, wherein the method comprising:
forming the chromium-based material film comprising 50 to 78 atom % of chromium by reactive spattering with chromium target being applied power of 0.1 to 10 W/cm$^2$ with respect to power per area of the sputtering surface of the target and with a combination of an inert gas and a reactive gas having a flow rate ratio of the reactive gas to the inert gas of at least 0.4 under a gas pressure of 0.01 to 1 Pa.

10. The method of claim 9, wherein the amount of warp is up to 50 nm.

11. The method of claim 9, wherein the ratio (A/B) is in a range from 0.75 to 0.85.

12. The method of claim 9, wherein the chromium-based material film has a thickness of in a range of 4 nm to 50 nm.

13. The method of claim 9, wherein the temperature of the heat treatment is up to 300° C.

14. The method of claim 9, wherein the chromium-based material film is a CrCNO film.

15. The method of claim 9, wherein the chromium-based material film is a monolayer film.

16. The method of claim 9, wherein the chromium-based material film comprises 2 to 10 atom % of nitrogen, 10 to 20 atom % of oxygen and 10 to 20 atom % of carbon.

* * * * *